(12) United States Patent
Giuntoli et al.

(10) Patent No.: US 12,061,243 B2
(45) Date of Patent: Aug. 13, 2024

(54) METHOD AND SYSTEM FOR EVALUATING A CONDITION OF A POWER GRID

(71) Applicant: Hitachi Energy Ltd, Zürich (CH)

(72) Inventors: Marco Giuntoli, Groß-Gerau (DE); Giancarlo Dalle Ave, Toronto (CA); Kevin Schoenleber, Schriesheim (DE); Robert Juhlin, Heidelberg (DE); Susanne Schmitt, Heidelberg (DE)

(73) Assignee: Hitachi Energy Ltd, Zurich (CH)

( * ) Notice: Subject to any disclaimer, the term of this patent is extended or adjusted under 35 U.S.C. 154(b) by 0 days.

(21) Appl. No.: 18/198,189

(22) Filed: May 16, 2023

(65) Prior Publication Data

US 2024/0003987 A1    Jan. 4, 2024

(30) Foreign Application Priority Data

May 17, 2022    (EP) .................................... 22173817

(51) Int. Cl.
*G01R 31/52*    (2020.01)
*G01R 31/58*    (2020.01)
(Continued)

(52) U.S. Cl.
CPC ............. *G01R 31/58* (2020.01); *G01R 31/52* (2020.01); *H02J 3/36* (2013.01);
(Continued)

(58) Field of Classification Search
CPC ........ G01R 31/58; G01R 31/52; G01R 31/62; G01R 31/50; G01R 31/086; G01R 31/40;
(Continued)

(56) References Cited

U.S. PATENT DOCUMENTS

| | | | | |
|---|---|---|---|---|
| 5,650,728 A | * | 7/1997 | Rhein | ................. G01R 31/088 324/543 |
| 10,707,774 B1 | * | 7/2020 | Harke | ..................... H02M 7/48 |

(Continued)

FOREIGN PATENT DOCUMENTS

| | | | |
|---|---|---|---|
| CN | 112924897 A | * | 6/2021 |
| CN | 113725908 A1 | | 11/2021 |
| EP | 3828557 A1 | | 6/2021 |

OTHER PUBLICATIONS

Extended European Search Report for the corresponding EP application No. 22173817.2 dated Nov. 3, 2022, 24 pages.

(Continued)

*Primary Examiner* — Jeffrey P Aiello
(74) *Attorney, Agent, or Firm* — Procopio, Cory, Hargreaves & Savitch LLP (57) ABSTRACT

The present disclosure relates to a method and system for evaluating a grid condition of an AC power grid. A time series of voltage and current signals of the AC power grid is captured and a local frequency of the AC power grid is identified. The time series of the voltage and current signals is transformed at the identified local frequency of the AC power grid into transformed signals. Equivalent circuit parameters are estimated from the transformed signals based on a description of an equivalent circuit of the AC power grid. A value of a grid condition indicator is determined based on the calculated equivalent circuit parameters and the identified local frequency of the AC power grid and processed in a grid monitoring system for evaluating the grid condition of the AC power grid.

13 Claims, 4 Drawing Sheets

(51) Int. Cl.
*H02J 3/36* (2006.01)
*H02J 13/00* (2006.01)

(52) U.S. Cl.
CPC ... *H02J 13/00001* (2020.01); *H02J 2003/365* (2013.01); *H02J 2203/20* (2020.01)

(58) Field of Classification Search
CPC .... G01R 31/42; G01R 19/2513; G01R 19/00; G01R 19/04; G01R 21/133; H02J 3/36; H02J 2003/365; H02J 13/00002; H02J 2300/28; H02J 3/0012; H02J 3/00; Y02E 40/70; Y04S 10/30; Y04S 10/22; Y02B 90/20
USPC ................. 307/18; 324/611, 764.01, 750.01; 700/286, 298, 297; 702/58, 60, 188, 57, 702/65, 64, 182
See application file for complete search history.

(56) References Cited

U.S. PATENT DOCUMENTS

| | | | | |
|---|---|---|---|---|
| 11,146,103 | B1* | 10/2021 | Davies | G06F 9/4401 |
| 2008/0036472 | A1* | 2/2008 | Collins | G01R 27/16 |
| | | | | 324/649 |
| 2012/0173174 | A1* | 7/2012 | Gaarder | H02J 13/00002 |
| | | | | 702/58 |
| 2015/0318705 | A1* | 11/2015 | Lucas | H02J 3/46 |
| | | | | 307/129 |
| 2015/0346287 | A1* | 12/2015 | Dong | G01R 31/58 |
| | | | | 702/183 |
| 2016/0126739 | A1* | 5/2016 | Shi | H02J 3/381 |
| | | | | 307/31 |
| 2018/0062390 | A1* | 3/2018 | Parashar | G01R 19/2513 |
| 2018/0306853 | A1* | 10/2018 | Kell | G01R 31/086 |
| 2020/0200809 | A1* | 6/2020 | Gaarder | G01R 21/133 |
| 2020/0292608 | A1* | 9/2020 | Yan | G06N 3/044 |
| 2020/0293627 | A1* | 9/2020 | Wang | G06F 30/367 |
| 2021/0165933 | A1* | 6/2021 | Larsson | H02J 3/00 |
| 2021/0367448 | A1* | 11/2021 | Finkelstein | H02J 13/00016 |
| 2023/0387809 | A1* | 11/2023 | Li | H02M 3/33523 |

OTHER PUBLICATIONS

Bagheri et al., "Estimation of Frequency-Dependent Impedances in Power Grids by Deep LSTM Autoencoder and Random Forest", Jun. 25, 2021, MDPI, Energies 2021, 14, 3829, https://doi/org/10.3390/en14133829, 14 pages.

Zhang, "Modeling and Control of VSC-HVDC Links Connected to Weak AC Systems", Royal Institute of Technology School of Electrical Engineering Electrical Machines and Power Electronics, Stockholm 2010, 232 pages.

Albuquerque Frazao, "PMU based situation awareness for smart distribution grids", HAL Id: tel-01224221 https://tel.archives-ouvertes.fr/tel-01224221, Université Grenoble Alpes, 2015, 232 pages.

* cited by examiner

METHOD AND SYSTEM FOR EVALUATING A CONDITION OF A POWER GRID

The present application claims priority to European Patent Application No. 22173817.2, filed on May 17, 2022, which is hereby incorporated herein by reference as if set forth in full.

The present disclosure relates to a method and system, in particular a grid monitoring system, for evaluating a grid condition of an AC power grid.

The transition from fossil fuel-based power generation to renewable generation poses large challenges for existing power systems. Additionally, the power grids of different countries are becoming more and more connected. Many of these interconnectors span long distances and connect asynchronously operated power systems. HVDC links are key to facilitate these interconnections and to enable full use of renewable generation.

One of the main benefits of these HVDC links is that the transmitted power is fully controllable enabling additional flexibility to AC power grids on one or both sides of a connected HVDC link. The flexibility that can be provided is limited by the strength of the connected AC power grids. A weak AC power grid can impact the operation of the HVDC station and, if not addressed, can result in consequences including trips of the HVDC station, overvoltage, low frequency resonances, and power instability (among others). An estimate of the strength of the connected AC power grid is therefore necessary to operate the HVDC station as smoothly as possible and support the AC power grid.

The nature of an AC/DC system interaction and the issues associated therewith are very much dependent on the strength (condition) of the AC power grid relative to the capacity of the HVDC link. The AC power grid can be considered "weak" due to two aspects: (a) the AC power grid equivalent impedance seen from the HVDC point of connection to the grid may be high, (b) the AC power grid mechanical inertia may be low. Since the strength of the AC power grid has a very significant impact on the AC/DC system interactions it is useful to have a simple means of measuring and comparing relative strengths of AC power grids.

Two metrics are typically defined to estimate the condition of the connected AC power grid, system inertia and the short-circuit ratio (SCR). Common solutions for estimating the condition of the connected grid involve a PLL (Phase Locked Loop) and a fixed phase estimate of grid voltages. These solutions do not perform well in the presence of phase deviations due to fast power/current dynamics, i.e. the estimated local frequency can be wrongly affected by the transient phase angle deviations.

The disclosure relates to implementations and embodiments of a method, software program and system for an improved evaluation of a grid condition of an AC power grid.

According to an implementation a respective method comprises the steps of:
  Capturing a time series of voltage and current signals of the AC power grid;
  Identifying a local frequency of the AC power grid;
  Transforming the time series of the voltage and current signals at the identified local frequency of the AC power grid into transformed signals;
  Estimating equivalent circuit parameters from the transformed signals based on a description of an equivalent circuit of the AC power grid;
  Determining a value of a grid condition indicator based on the calculated equivalent circuit parameters and the identified local frequency of the AC power grid; and
  Processing the value of the grid condition indicator in a grid monitoring system for evaluating the grid condition of the AC power grid.

This method provides an estimation of equivalent circuit parameters of the AC power grid for determining a value of a grid condition indicator based on which the grid condition of the AC power grid can be evaluated. For this purpose the method uses a comprehensive description of an equivalent circuit (grid voltage model) of the AC power grid that takes care of possible grid voltage frequency variations or oscillations.

In this way, the local frequency of the AC power grid can be estimated and utilized in a better and enhanced way compared to what has been realized so far in common solutions. Further, this enhances the determination of the value of the grid condition indicator based on the calculated equivalent circuit parameters and the identified local frequency of the AC power grid. The method enables better processing results or processing conditions in an (automated) grid monitoring system for the evaluation of the grid condition and helps to deliver better quality grid services and reduces the risk of network contingencies.

The captured voltage signals are, for example, phase-to-ground voltages of respective phases, e.g. three phases, of the AC power grid. The captured current signals are, for example, phase currents of respective phases, e.g. three phases, of the AC power grid. The time series of the voltage and current signals is captured over a defined time horizon (time window), the duration of which is, for example, selected in a range of 100 ms to 10 s. However, the selected time horizon is not limited to these bounds.

In general, the captured voltage and current signals are any voltage and current signals measurable in the power system. This may include voltage and current signals at a transformer, power line, monophase or multiphase configuration of a respective power system.

The voltage and current signals can be captured at any suitable or determined measurement point. For example, in an AC/DC power system with an HVDC station, the point of capturing the voltage and current signals could be at the so called point of common coupling (PCC) which connects the HVDC station to the AC power grid.

In this way, the voltage and current signals are a time-domain input of the method. The voltage and current signals are, for example, sampled with a constant sampling rate, e.g. 5 kHz or 10 kHz. The input values can be expressed with their respective SI magnitude (Volt and Ampere respectively). Preferably, an appropriated per-unit transformation is done to prevent numerical instability and increase the signals readability.

The equivalent circuit of the AC power grid is, for example, described using a so-called Thévenin circuit description of the AC power grid. According to Thévenin's theorem a series model of an equivalent impedance Z and equivalent voltage source E can be applied for replacing the circuit description of the real AC power grid by an equivalent circuit description in power system analysis. The Thévenin circuit description of the AC power grid can, for example, be formulated as:

$$V(t) = RI(t) + L\frac{dI(t)}{dt} + E(t)$$

Here, V(t) describes the phase-to-ground voltages, I(t) describes the phase currents, E(t) describes any power generators or any electric power generated in the AC power grid, R describes the equivalent resistance, and L describes the equivalent inductance. The equivalent impedance Z can then be expressed as $$Z = R + jX = R + 2\pi fL$$

where R describes the real value (ohmic resistance) and $X = 2\pi fL$ describes the frequency f dependent imaginary value (reactance) of equivalent impedance Z.

In case of a three-phase system, the time variable quantities V(t), I(t), and E(t) are [3×1] vectors and R and L are matrices [3×3]. In general, the dimensions of the variables depend on the dimension of the measured signals. The method can generally be applied to single or multi-phase systems. Hence, in systems with n measured phase signals, the time variable quantities V(t), I(t), and E(t) are [n×1] vectors and R and L are matrices [n×n].

Based on the Thévenin circuit description, as explained above, the description of the equivalent circuit of the AC power grid can be formulated as a model for further processing according to the above-described method. In this regard, it is not necessary to know any a priori information, e.g. parameter bounds, initial values, etc.

The equivalent circuit parameters are estimated from the transformed signals based on the description of the equivalent circuit of the AC power grid, for example, by using a least-squares optimization method. The least-squares method achieves excellent immunity of the method to any input errors/gaussian noise, a robustness of the method, and a total absence of tuning parameters which makes this approach easy to implement, test and use. Moreover, it proves good results even in presence of ill-conditioned input data/system and it guaranties the global optimum solution in a closed-form formulation.

According to a further implementation, the method comprises:
  Transforming the time series of the voltage and current signals at a nominal frequency of the AC power grid into first transformed signals;
  Identifying the local frequency of the AC power grid based on the first transformed signals, e.g. from a frequency drift of the first transformed signals;
  Transforming the time series of the voltage and current signals at the identified local frequency into second transformed signals;
  Estimating the equivalent circuit parameters from the second transformed signals based on the description of the equivalent circuit of the AC power grid.

These steps have the effects and advantages that the identification of the real (local) frequency, which could deviate from a nominal frequency of the AC power grid, can be improved. The transformation of the time series of the voltage and current signals into the first transformed signals has the effect that nominal frequency dependent temporal signal components are not considered further. In this way, a deviation from the nominal frequency, i.e. a frequency drift of the first transformed signals regarding the nominal frequency, can be identified in an enhanced manner. This enables a determination/estimation of a local (real) frequency prevailing in the AC power grid at the time the voltage and current signals are captured.

The subsequent transformation of the time series of the voltage and current signals into the second transformed signals has the further effect that local frequency dependent temporal signal components are not considered further. In this way, an estimation of the equivalent circuit parameters is particularly accurate, since the estimation is not disturbed or distorted by temporal signal changes of the voltage and current signals that depend on the local frequency of the AC power grid. This enhances an accurate processing and evaluation of the grid condition indicator in the automated grid monitoring system.

According to an exemplary implementation one or both of the transformations into the first and second transformed signals is performed by application of a Park transformation to the captured voltage and current signals. In particular, regarding three-phase voltage and current signals, the Park transformation has the advantage of reducing three-dimensional voltage and current signals into two-dimensional voltage and current signals. The Park transformation hereby describes three-phase systems as superposition of a two-dimensional d, q signal frame which rotates with the nominal or estimated local frequency respectively.

According to a further implementation, the method comprises the additional step of:
  Filtering the voltage and current signals before transforming the time series of the voltage and current signals into the transformed signals.

Filtering the voltage and current signals has the effect of removing harmonic and inter harmonic components that may degrade the dynamic of the subsequent transformation of the time series of the voltage and current signals into the transformed signals. For example, the filtering is performed by a bandpass filter centered around the nominal frequency of the AC power grid. Alternatively, the filtering is performed by a low-pass filtering strategy applying a low-pass filter. The cut-off frequency of the low-pass filter can be configured depending on the nominal frequency of the AC power grid.

According to a further implementation, the method comprises the additional step of:
  Filtering the transformed signals by an averaging filter before estimating the equivalent circuit parameters.

Filtering the transformed signals by an averaging filter has the effect of removing oscillation due to unbalanced signals. For example, such filtering stage minimizes the $2^{nd}$ order harmonics in the transformed signals. The averaging filter is, for example, a three-point moving average filter. The three-point averaging can be implemented such that signal quantities corresponding to 0-, 60- and 120-degrees quantities of captured three-phase voltage and current signals are considered for the signal averaging. This has the effect that signal quantities are averaged that lie within a respective 120 degree phase shift of respective two of the three-phase voltage and current signals.

According to a further implementation of the method the equivalent circuit parameters comprise equivalent impedance component parameters and equivalent voltage source parameters of the AC power grid. In this way, a comparatively easy to implement estimation of the equivalent circuit parameters can be achieved which, nevertheless, results in particularly accurate estimation results and enhances an accurate processing and evaluation of the grid condition indicator in the automated grid monitoring system.

The description of the equivalent circuit of the AC power grid can formally be modelled based on the equivalent circuit parameters, the transformed signals and the identified local frequency of the AC power grid. For example, the description of the equivalent circuit is formulated within a Park transformed Thévenin circuit description based on the Thévenin formulation as explained above. In this regard, the equivalent impedance component parameters e.g. comprise a parameter r describing an equivalent resistance component, a parameter l describing an equivalent inductance component, and parameters $e_d$, $e_q$ describing Park transformed equivalent voltage source parameter components of any power generators or any electric power generated in the AC power grid. The equivalent circuit parameters r, l and $e_{d/q}$ are hence to be estimated by the explained method. The r and l parameter values can be assumed to be fixed during the entire time horizon of capturing the time series of the voltage and current signals, i.e. it can be assumed that the grid topology and the system load level do not change during the time horizon.

Under the above assumptions, the Park transformed Thévenin circuit description can be formulated as follows:

$$v_d(t) = ri_d(t) - \omega l i_q(t) + l\frac{di_d(t)}{dt} + e_d$$

$$v_q(t) = ri_q(t) + \omega l i_d(t) + l\frac{di_q(t)}{dt} + e_q$$

with $\omega=2\pi f$, and where the indices d and q assign the parameters to the two dimensions of the d, q signal frame rotating with the angular frequency $\omega$ according to the Park transformation as explained above. In this case, r and l refer to the positive sequence only, i.e. the mutual-self value in the original [3×3] matrix (omitting the homopolar sequence).

Assuming a single steady-state condition (without noise and natural oscillations), local voltages and currents are the known/measured variables (and time derivative parts are omitted). Simultaneously, r, l and $e_{d/q}$ are unknown variables. This means that this problem's solution is unknown because the equation system is underdetermined. Since there are more unknown variables than equations the system is underdetermined, and a unique solution is not known.

Considering having another steady-state condition (where only the local electrical quantities changed), now the question system can be solved with a unique solution. With many steady-state conditions (>2), the problem becomes overdetermined and cannot be solved as systems of linear equations.

According to a further implementation of the method the equivalent voltage source parameter comprises a decomposition into harmonic components depending on a frequency deviation from the local frequency of the AC power grid. This has the effect of considering possible natural system magnitude/phase/frequency fluctuations within the AC power system. The voltage/power sources in the AC power system can change their magnitude/phase/frequency during the time horizon of capturing the voltage and current signals. Hence, also the equivalent voltage source parameter can slightly change during the time horizon. By modelling the equivalent voltage source parameter as a decomposition into harmonic components, such fluctuations and non-linearity regarding a working point of the equivalent voltage source parameter can be taken into account, which further enhances an accurate processing and evaluation of the grid condition indicator in the automated grid monitoring system based on the estimated equivalent circuit parameters.

Under these assumptions, the above-explained Park transformed Thévenin circuit description can be formulated as follows:

$$v_d(t) = ri_d(t) - \omega l i_q(t) + l\frac{di_d(t)}{dt} + \sum_{h=0}^{N_h} e_{h,d}\cos(\theta_h(t)) - e_{h,q}\sin(\theta_h(t))$$

$$v_q(t) = ri_q(t) + \omega l i_d(t) + l\frac{di_q(t)}{dt} + \sum_{h=0}^{N_h} e_{h,d}\sin(\theta_h(t)) + e_{h,q}\cos(\theta_h(t))$$

where $$\sum_{h=0}^{N_h} e_{h,d}\cos(\theta_h(t)) - e_{h,q}\sin(\theta_h(t)) \text{ and}$$

$$\sum_{h=0}^{N_h} e_{h,d}\sin(\theta_h(t)) + e_{h,q}\cos(\theta_h(t))$$

describe the decomposition of the equivalent voltage source parameter into harmonic components.

According to a further implementation of the method, in addition to the above expressions, also power balance equations can be included in the equivalent circuit description serving as estimation model. For example, active power p(t) and reactive power q(t) expressions can also be modelled based on the Park transformed voltage and current signals as follows:

$$p(t) = r(i_d(t)^2 + i_q(t)^2) + i_d(t)\sum_{h=0}^{N_h} e_{h,d}\cos(\theta_h(t)) -$$

$$e_{h,q}\sin(\theta_h(t)) + i_q(t)\sum_{h=0}^{N_h} e_{h,d}\sin(\theta_h(t)) + e_{h,q}\cos(\theta_h(t))$$

$$q(t) = x(i_d(t)^2 + i_q(t)^2) - i_q(t)\sum_{h=0}^{N_h} e_{h,d}\sin(\theta_h(t)) +$$

$$e_{h,q}\cos(\theta_h(t)) + i_d(t)\sum_{h=0}^{N_h} e_{h,d}\sin(\theta_h(t)) + e_{h,q}\cos(\theta_h(t))$$

Hence, the equivalent circuit description can finally be modelled by applying the above-explained Park transformed Thévenin circuit description and/or the above-explained Park transformed active power p(t) and reactive power q(t) expressions.

According to a further implementation of the method the grid condition indicator is based on a short circuit capacity of the AC power grid. The short circuit capacity (SCC) of the AC power grid can be defined as:

$$SCC = \frac{E_{AC}^2}{Z_s} [GVA]$$

where $E_{AC}$ is an average value of the time-dependent equivalent voltage source E(t) and $Z_s$ is the equivalent impedance according to the Thévenin circuit description as explained above.

The SCC can be normalized to the short circuit ratio (SCR) of the AC power grid as:

$$SCR = \frac{SCC}{P_n} [-]$$

where $P_n$ is the rated power, e.g. of an HVDC converter station connected to the AC power grid. Different graduations of the SCR reflect different grid conditions of the AC power grid regarding the strength of the AC power grid. For example, the following classification can be made:

Strong system, if the SCR of the AC power grid is greater than 3.0;
Weak system, if the SCR of the AC power grid is between 2.0 and 3.0;
Very weak system, if the SCR of the AC power grid is lower than 2.0.

The grid condition indicator is, for example, modelled as SCC or SCR parameter as explained above. In this way, the method can provide a very accurate, yet easy to classify grid condition indicator, the value of which is determined based on the calculated equivalent circuit parameters and the identified local frequency of the AC power grid as explained above. The value of the grid condition indicator is processed in an automated grid monitoring system for evaluating the grid condition of the AC power grid, for example, based on the above classification.

According to a further implementation of the method the step of processing the value of the grid condition indicator in the automated grid monitoring system for evaluating the grid condition of the AC power grid comprises at least one of the following actions based on the determined value of the grid condition indicator:

Automatic online selection of a control scheme for an HVDC station connected to the AC power grid;
Validation of threshold values and ranges of the grid condition indicator;
Voltage stability identification;
Updating of an alarm, warnings or information scheme for the grid condition indicator;
Detection of local topology changes of the AC power grid;
Visualization of the value of the grid condition indicator;
Setting additional power set points for the HVDC station.

According to an example application, an automatic online selection of a control scheme for an HVDC station connected to the AC power grid includes, for example, a feedback loop to a control system for controlling power generators within the AC power grid based on the evaluated grid condition of the AC power grid. Alternatively or additionally, an HVDC station connected to the AC power grid may be controlled based on the evaluated grid condition of the AC power grid. For example, different control schemes or adapted thresholds are applied depending on whether the evaluated grid condition of the AC power grid indicates a strong grid or a weak grid. This enhance a secure, stable and reliable operation of a connected power grid.

According to another example application, threshold values and ranges of the grid condition indicator can be validated, consolidated or modified based on the evaluated grid condition of the AC power grid. For example, boundary numbers (ranges of the grid condition indicator) reported by a transmission system operator (TSO) are validated, consolidated or modified in the automated grid monitoring system for securely controlling the AC power grid and/or an HVDC station connected to the AC power grid. This further enhances a secure, stable and reliable operation of a connected power grid.

According to another example application, voltage stability identification is performed in the automated grid monitoring system based on boundaries/thresholds of the grid condition indicator. This further enhance voltage stability and grid safety, in particular in connected power grids with asynchronously or heterogeneously operated power systems.

According to another example application, an alarm, warnings or information scheme for the grid condition indicator is updated in the automated grid monitoring system.

Alternatively or additionally, local topology changes of the AC power grid are detected by the automated grid monitoring system. For example, once the local topology of the AC power grid changes, the impedance of the AC power grid changes. This is estimated and detected by the above-explained method and results in a changed value of the grid condition indicator. As a result, alarm, warnings or information schemes can be modified/adapted accordingly. Alternatively or additionally, the value of the grid condition indicator and/or measures derived therefrom are visualized in the automated grid monitoring system.

According to an implementation of a respective software program product, it comprises a software program with program code which, when executed in a processor, performs the method of the kind described above. In this way, the software program product achieves the same effects and advantages as mentioned in the context of the method of the kind explained above. In particular, the software program product enhances a secure, stable and reliable operation of a connected power grid, when performing a respective method.

According to an embodiment a respective grid monitoring system for evaluating a grid condition of an AC power grid is configured to perform the method of the kind described above. In this way, the grid monitoring system achieves the same effects and advantages as mentioned in the context of the method of the kind explained above. In particular, the grid monitoring system enhances a secure, stable and reliable operation of a connected power grid, when performing a respective method. For example, the grid monitoring system is an automated or semi-automated grid monitoring system like a SCADA system or any other supervisory system connected to a power grid.

According to a further embodiment the grid monitoring system comprises a processor and a software program with program code which, when executed in the processor, performs the method of the kind described above. The program code is e.g. stored in a memory of the grid monitoring system.

The method and the software program product described above are particularly suitable/configured/implemented for the grid monitoring system described above and vice versa. Features and advantages described in connection with the method or the software program product can therefore be used for the grid monitoring system and vice versa.

Every feature, aspect, effect and advantage described with respect to the method of the kind described above is also disclosed herein with respect to the software program product or the grid monitoring system described above, even if the respective feature, aspect, effect and advantage is not explicitly mentioned in the context of the software program product or the grid monitoring system described above.

The accompanying figures are included to provide a further understanding. In the figures, elements of the same structure and/or functionality may be referenced by the same reference signs. It is to be understood that the embodiments shown in the figures are illustrative representations and are not necessarily drawn to scale.

Figure 1:
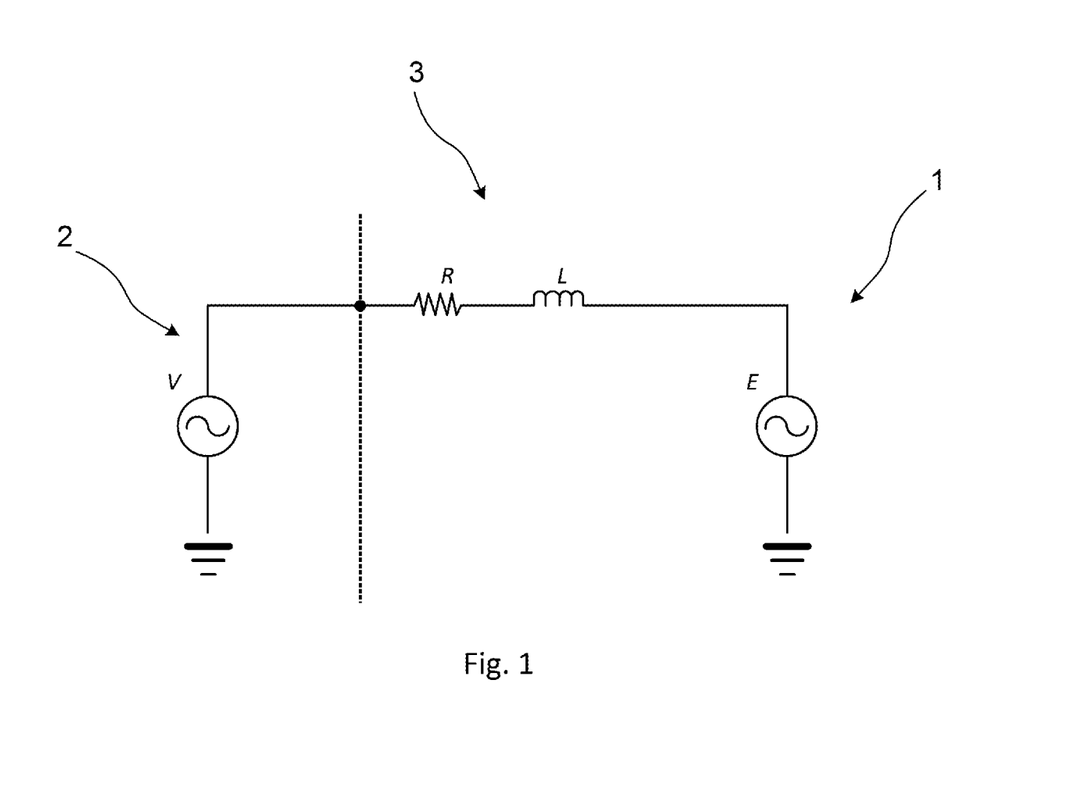
FIG. 1 is a schematic view of an equivalent circuit description of an AC power grid and a connected HVDC station according to an exemplary embodiment.

FIG. 1 shows a schematic view of an equivalent circuit description of an AC power grid 1 and an HVDC station 2 connected to the AC power grid 1. The AC power grid 1 is connected to the HVDC station 2 at a point of common coupling (PCC). The AC power grid 1, for example, comprises a certain topology of grid infrastructure, like transmission lines, power generators (power sources), etc. In terms of an electric circuit description the electric characteristics of the AC power grid 1 can be described by an equivalent electric impedance and an equivalent voltage source. The electric impedance can be formulated as:

$Z=R+jX=R+2\pi fL$

The equivalent voltage source can be described as E. Hence, initially, the variables R, L, and E of an equivalent circuit description of the AC power grid 1 are unknown.

The description of the equivalent circuit 3 according to FIG. 1 is a so-called Thévenin circuit description of the system. The description of the equivalent circuit 3 according to FIG. 1 can be formulated based on the assumption of replacing a circuit description of the HVDC station 2 according to FIG. 1 by an equivalent voltage source V and formulating the description of the AC power grid 1 as a series model of equivalent impedance $Z=R+2\pi fL$ and equivalent voltage source E. The description of the equivalent circuit 3 according to FIG. 1 can, for example, be formulated by considering a closed Kirchhoff loop starting at a voltage drop to ground at the point of common coupling, PCC (see dotted line), for example, and across the equivalent circuit description of the AC power grid 1. In other words, the Thévenin circuit description 3 according to FIG. 1 can be formulated as:

$$V(t) = RI(t) + L\frac{dI(t)}{dt} + E(t)$$

Based on this equivalent circuit description, a grid condition of the AC power grid 1 is to be evaluated by determining a value of a grid condition indicator. The value of the grid condition indicator can then be processed in a grid monitoring system for evaluating the grid condition of the AC power grid 1. Such method will be described in the following.

Figure 2:
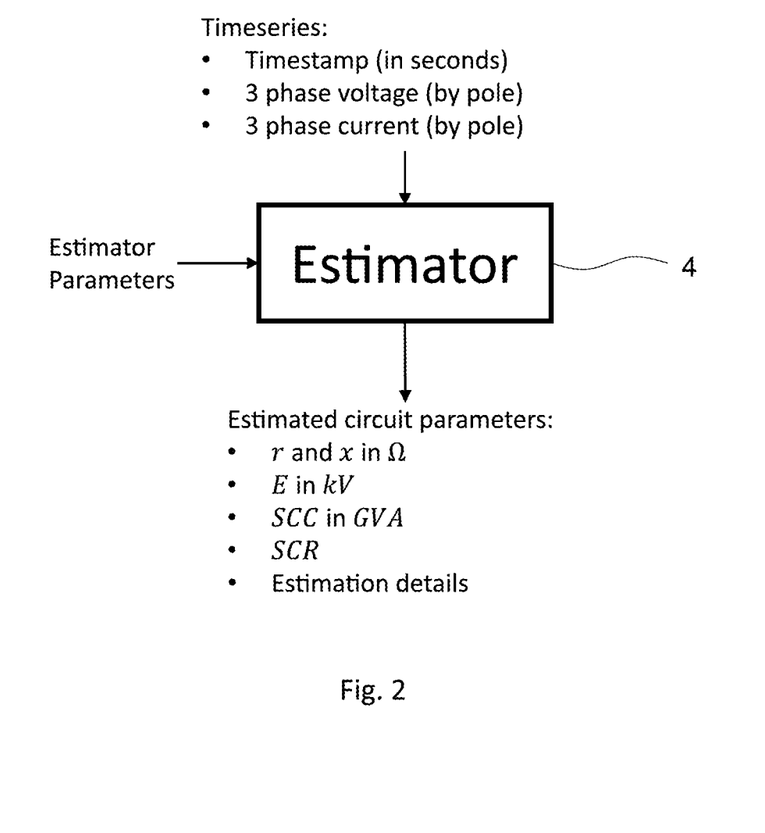
FIG. 2 is a schematic overview of an algorithmic method for evaluating a grid condition of the AC power grid according to FIG. 1.

FIG. 2 is a schematic overview of an algorithmic method for evaluating a grid condition of the AC power grid 1 according to FIG. 1. In the exemplary implementation, the method is a passive and asynchronous time domain method. This means that no signal noise is actively injected and the system behaviour of the AC power grid 1 is not actively changed (passive). Moreover, this means that different chunks of time series of captured voltage and current signals are used (asynchronous).

FIG. 2 shows an estimator 4 for estimating a value of a grid condition indicator of the AC power grid 1. The estimator 4 is parameterised by estimator parameters which are input to the estimator 4.

As a time-domain input to the estimator 4 a time series of voltage and current signals of the AC power grid 1 is captured. The voltage signals are exemplarily assumed to be the phase-to-ground voltage waveforms for each phase and the current signals are exemplarily assumed to be the phase current waveforms. Hence, in the exemplary configuration according to FIG. 2, voltage and current signals of three phases per pole of the AC power grid 1 are captured. In case of a monopole structure of the AC power grid 1, three voltage and three current signals are needed (each per phase). In case of a bipole structure of the AC power grid 1 with two poles, three voltage and three current signals per phase and per pole are needed, leading to 3×2 voltage and 3×2 current signals, i.e. in sum 12 waveform signals.

The captured time series of the voltage and current signals is sampled with a constant sampling time, e.g. 5 or 10 kHz. The time horizon of the captured time series is e.g. between 100 ms and 10 s. It is not necessary to know any a priori information, like parameter bounds, initial values, etc.

An output of the estimator 4 yields estimated circuit parameters of the equivalent Thévenin circuit description of the AC power grid 1 according to FIG. 1. The estimated circuit parameters comprise for example equivalents impedance component parameters r and l, the parameter of the equivalent voltage source E, an estimated short circuit capacity SCC of the AC power grid 1 and/or a short circuit ratio SCR calculated from the short circuit capacity SCC. SCC and SCR can, for example, be formulated as explained above. Moreover, some estimation details can also be output by the estimator 4. The estimator 4 is for example an algorithmic software program with program code which can be executed in a processor, e.g. a processor within an automated grid monitoring system for evaluating the grid condition of the AC power grid 1.

Figure 3:
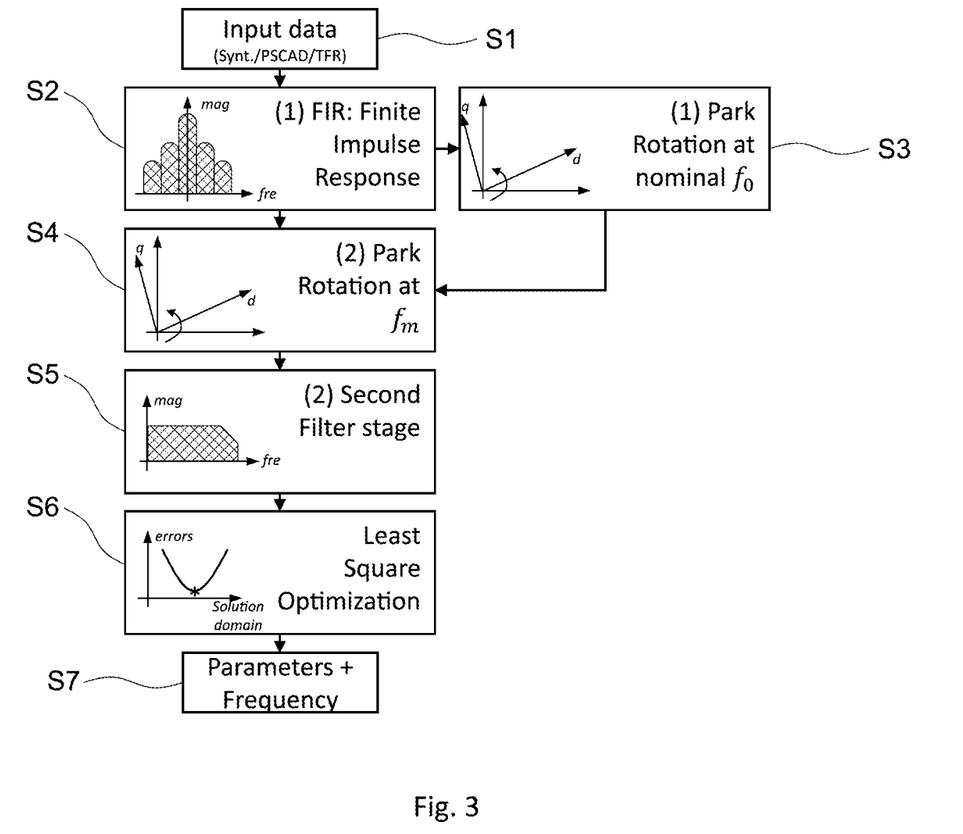
FIG. 3 is a detailed view of the algorithmic method according to FIG. 2.

FIG. 3 is a detailed view of the algorithmic method according to FIG. 2. In step S1, the captured time series of the voltage and current signals, as explained above, and corresponding time stamps of respective sampling points per sample time are input to the algorithmic procedure. These input data can be gained by real-time system data (Synt.), by simulation (PSCAD) or by a time-frequency representation of recorded data (TFR). In the case that a sampling time is not constant, an interpolation stage and/or a per unit transformation must be executed before further processing of the input data in order to normalize the input signal scale.

In a step S2, the sampled input data are filtered by a finite impulse response (FIR) bandpass filter centered around a nominal frequency $f_0$ of the AC power grid 1 or by a low pass filtering method. The goal of this filter stage is to remove harmonic and inter harmonic components in the sampled input data that may degrade the dynamic of a subsequent signal transformation.

In a step S3, a first Park transformation at the nominal frequency $f_0$ of the AC power grid 1, i.e. 50/60 Hz, is done to identify the local (real) frequency $f_m$ of the AC power grid 1 (based on the voltage signals). For this purpose, the input data, i.e. in this exemplary implementation the sampled time series of the voltage signals, is transformed at the nominal frequency $f_0$ into first Park transformed d, q signals based on the current signals. Subsequently, the local frequency $f_m$ of the AC power grid 1 is identified based on the first Park transformed d, q signals. This is done by identifying e.g. a trigonometric frequency drift of the first Park transformed d, q signals, i.e. by identifying a frequency deviation of the first Park transformed d, q signals from the nominal frequency $f_0$ of the AC power grid 1.

In a step S4, the input data, i.e. the sampled time series of the voltage and current signals, is transformed by a second Park transformation at the identified local frequency $f_m$ into second Park transformed d, q signals. After the second Park transformation, the input data is independent of time-domain changes of the voltage and current signals that are due to the local frequency $f_m$. In other words, local frequency $f_m$ dependent temporal signal components are not considered further.

In a step S5, a second filtering stage using a three-point averaging method (moving average filter) is performed to remove oscillations in the second Park transformed input signals which originate from unbalanced signals, e.g. originating from unbalanced converter waveforms of the HVDC station 2 connected to the AC power grid 1. In particular, by this second filtering stage, $2^{nd}$ order harmonics in the Park transformed input signals are minimized. The three-point averaging filtered signals can be formulated as:

$$y[k] = \frac{1}{3}(u[k] + u[k-A] + u[k-2A])$$

The A parameter may preferably be chosen in order to average 0-, 60- and 120-degrees quantities, since the underlying three-phase input signal waveforms comprise a 120 degree phase shift to each other, and can be formulated as:

$$A = \frac{1}{6 f_m T_s}$$

where $f_m$ is the estimated local frequency and $T_s$ is the sampling time.

Based on these method steps S1 to S5 performed so far, the Thévenin circuit description 3 according to FIG. 1 (see above explanations) can be formulated in the discrete time domain as:

$$v_d[k] =$$
$$ri_d[k] + x\left(\frac{i_d[k] - i_d[k-1]}{\omega_m T_s} - i_q[k]\right) + \sum_{h=0}^{N_h} e_d[k]\cos(\theta_h[k]) - e_q[k]\sin(\theta_h[k])$$

$$v_q[k] =$$
$$ri_q[k] + x\left(\frac{i_q[k] - i_q[k-1]}{\omega_m T_s} + i_d[k]\right) + \sum_{h=0}^{N_h} e_d[k]\sin(\theta_h[k]) + e_q[k]\cos(\theta_h[k])$$

where $\omega_m = 2\pi f_m$ and k is a respective sampling point.

The last terms $$\sum_{h=0}^{N_h} e_d[k]\cos(\theta_h[k]) - e_q[k]\sin(\theta_h[k]) \text{ and}$$
$$\sum_{h=0}^{N_h} e_d[k]\sin(\theta_h[k]) + e_q[k]\cos(\theta_h[k])$$

represent the harmonics decomposition of the equivalent grid generators (equivalent voltage source parameter) E, with a maximum order $N_h$ (i.e. maximum deviation from the local frequency $f_m$ used during the second Park transformation). The parameter $\theta_h[k]$ is calculated accordingly as:

$$\theta_h[k] = 2\pi \Delta f_h t[k]$$

where t[k] is the time related to the sampling point k, while $\Delta f_h$ is the frequency deviation from the local frequency $f_m$ related to the harmonic h. For the present exemplary application, a maximum frequency deviation of 500 mHz with a discretization of 500 µHz have been chosen.

Moreover, based on the above formulations, discretized power balance equations can be formulated as follows, wherein the first equation formulates the active power balance and the second equation formulates the reactive power balance:

$$v_d[k]i_d[k] + v_q[k]i_q[k] + 2v_0[k]i_0[k]$$
$$= r(i_d[k]^2 + i_q[k]^2)$$
$$+ \sum_{h=0}^{N_h} e_d[k](i_d[k]\cos(\theta_h[k]) + i_q[k]\sin(\theta_h[k]))$$
$$+ \sum_{h=0}^{N_h} e_d[k](-i_d[k]\sin(\theta_h[k]) + i_q[k]\cos(\theta_h[k]))$$

$$v_q[k]i_d[k] - v_d[k]i_q[k]$$
$$= x(i_d[k]^2 + i_q[k]^2)$$
$$+ \sum_{h=0}^{N_h} e_d[k](i_d[k]\sin(\theta_h[k]) - i_q[k]\cos(\theta_h[k]))$$
$$+ \sum_{h=0}^{N_h} e_d[k](i_d[k]\sin(\theta_h[k]) + i_q[k]\sin(\theta_h[k]))$$

The voltage/power sources in the AC power system can change their magnitude/phase/frequency during the time horizon of capturing the voltage and current signals. Hence, also the equivalent voltage source parameter E can slightly change during the time horizon. By modelling the equivalent voltage source parameter E as a decomposition into harmonic components, such fluctuations and non-linearity regarding a working point of the equivalent voltage source parameter E can be taken into account, which further enhances an accurate processing and evaluation of the grid condition indicator.

Based on the Thévenin circuit description 3 formulated in the discrete time domain as explained above, in a further step S6, a Least Squares optimization stage is performed to identify the equivalent circuit parameters, inter alia r and $x = \omega_m l$, as well as the grid side voltage and frequency deviations. The r and x values are assumed to be fixed during the entire time window, i.e. the grid topology and the system load level do not change during the time horizon.

In a further step S7, the estimated equivalent circuit parameters as well as the grid side voltage and frequency deviations are output. These are then further processed in the automated grid monitoring system for calculating the respective values of SCC/SCR for evaluating the grid condition of the AC power grid 1. For example, the processing comprises at least one of the following actions based on the determined values of SCC/SCR: Automatic online selection of a control scheme for the HVDC station 2 connected to the AC power grid 1 (see FIG. 1); validation of threshold values and ranges of the values of SCC/SCR; voltage stability identification; updating of an alarm, warnings or information scheme for the values of SCC/SCR; detection of local topology changes of the AC power grid 1; visualization of the values of SCC/SCR or other parameters.

In this way, the method, performed in the grid monitoring system, enhances a secure, stable and reliable operation of the AC power grid 1. For example, the automated grid monitoring system is a SCADA system or any other supervisory system connected to the AC power grid 1.

Figure 4:
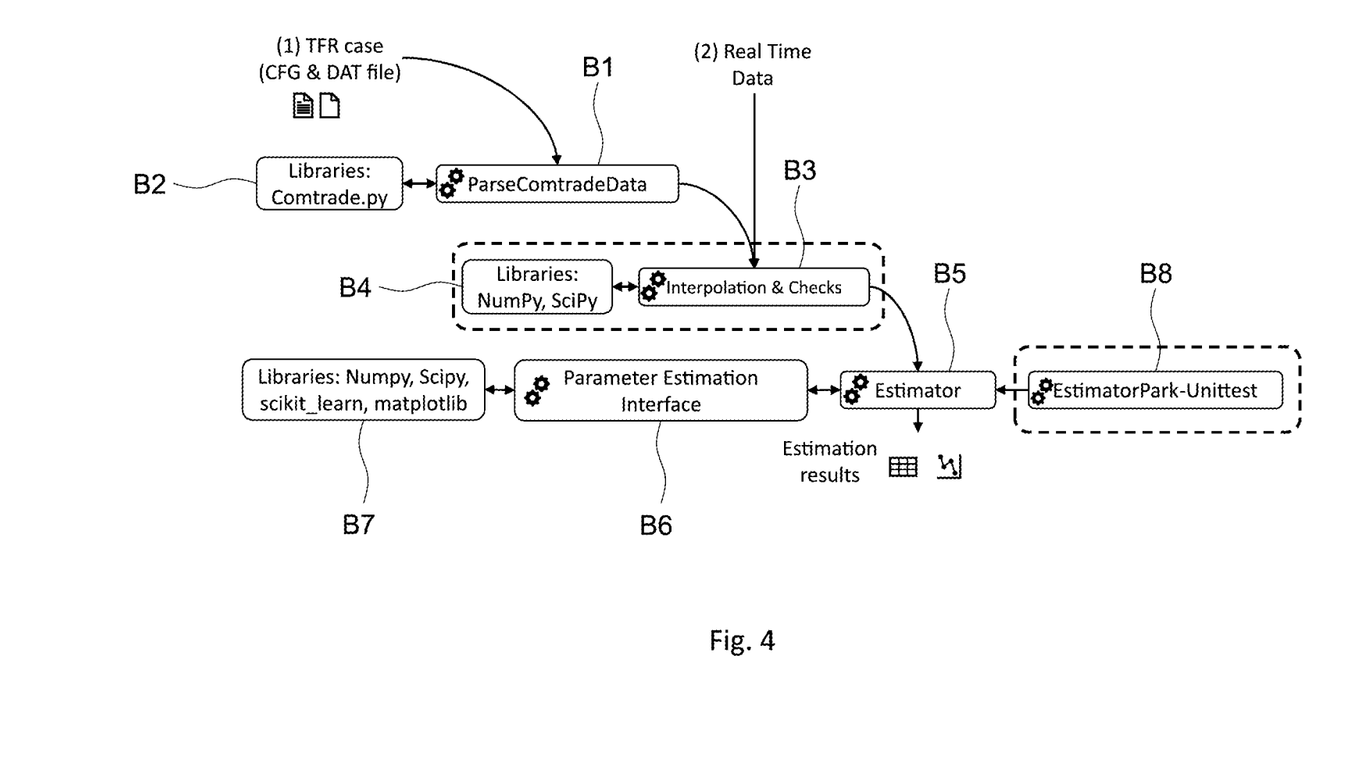
FIG. 4 is a schematic view of program blocks of the algorithmic method according to FIGS. 2 and 3.

FIG. 4 is a schematic view of program blocks of the algorithmic method according to FIGS. 2 and 3. For example, the program blocks according to FIG. 4 represent the software program code according to the programming language Python. In block B1, recorded TFR input data are processed and captured by aid of special libraries as indicated in block B2. The data are then further processed in block B3 by aid of special libraries as indicated in block B4.

Additionally or alternatively to the recorded TFR input data, real-time data can be directly processed in block B3 by aid of special libraries as indicated in block B4.

Then, the captured and processed data are input to the estimator of block B5 by aid of special libraries and interfaces as indicated in blocks B6 and B7. The estimator of block B5 for example corresponds to the estimator 4 and the respective method as explained above with regard to FIGS. 3 and 4. A block B8 has the purpose of testing the estimator of block B5. After performing the respective method steps in estimator of block B5, the respective estimation results can be output.

While the disclosure is amenable to various modifications and alternative forms, specifics thereof have been shown by way of example in the figures. It should be understood, however, that the intention is not to limit the disclosure to the particular embodiments described. On the contrary, the intention is to cover all modifications, equivalents, and alternatives falling within the scope of the disclosure defined by the appended claims.

REFERENCE SIGNS

1 AC power grid
2 HVDC station
3 equivalent circuit
4 estimator
B1-B8 program blocks
S1-S7 method steps

What is claimed is:

1. A method for evaluating a grid condition of an AC power grid, the method comprising the steps of:
   capturing a time series of voltage and current signals of the AC power grid;
   transforming the time series of the voltage and current signals at a nominal frequency of the AC power grid into first transformed signals;
   identifying a local frequency of the AC power grid based on the first transformed signals;
   transforming the time series of the voltage and current signals at the identified local frequency of the AC power grid into second transformed signals;
   estimating equivalent circuit parameters from the second transformed signals based on a description of an equivalent circuit of the AC power grid;
   determining a value of a grid condition indicator based on the calculated equivalent circuit parameters and the identified local frequency of the AC power grid; and
   processing the value of the grid condition indicator in a grid monitoring system for evaluating the grid condition of the AC power grid, wherein the step of processing the value of the grid condition indicator in the grid monitoring system for evaluating the grid condition of the AC power grid comprises at least one of the following actions based on the determined value of the grid condition indicator:
      automatic online selection of a control scheme for an HVDC station connected to the AC power grid;
      validation of threshold values and ranges of the grid condition indicator;
      voltage stability identification;
      updating of an alarm, warnings or information scheme for the grid condition indicator;
      detection of local topology changes of the AC power grid;
      visualization of the value of the grid condition indicator; or
      setting additional power set points for the HVDC station.

2. The method according to claim 1, comprising the additional step of:
   filtering the voltage and current signals before transforming the time series of the voltage and current signals into the transformed signals.

3. The method according to claim 1, comprising the additional step of:
   filtering the transformed signals by an averaging filter before estimating the equivalent circuit parameters.

4. The method according to claim 2, comprising the additional step of:
   filtering the transformed signals by an averaging filter before estimating the equivalent circuit parameters.

5. The method according to claim 1, wherein the equivalent circuit parameters comprise equivalent impedance component parameters and equivalent voltage source parameters of the AC power grid.

6. The method according to claim 2, wherein the equivalent circuit parameters comprise equivalent impedance component parameters and equivalent voltage source parameters of the AC power grid.

7. The method according to claim 1, wherein the grid condition indicator is based on a short circuit capacity of the AC power grid.

8. The method according to claim 2, wherein the grid condition indicator is based on a short circuit capacity of the AC power grid.

9. The method according to claim 3, wherein the grid condition indicator is based on a short circuit capacity of the AC power grid.

10. A grid monitoring system for evaluating a grid condition of an AC power grid, wherein the grid monitoring system is configured to perform the method according to claim 1.

11. A non-transitory computer-readable medium having instructions stored thereon, wherein the instructions, when executed by a processor, cause the processor to perform the method according to claim 1.

12. A method for evaluating a grid condition of an AC power grid, the method comprising the steps of:
   capturing a time series of voltage and current signals of the AC power grid;
   identifying a local frequency of the AC power grid;
   transforming the time series of the voltage and current signals at the identified local frequency of the AC power grid into transformed signals;
   filtering the transformed signals by an averaging filter;
   estimating equivalent circuit parameters from the filtered transformed signals based on a description of an equivalent circuit of the AC power grid, wherein the equivalent circuit parameters comprise an equivalent voltage source parameter of the AC power grid, and wherein the equivalent voltage source parameter comprises a decomposition into harmonic components depending on a frequency deviation from the local frequency of the AC power grid;
   determining a value of a grid condition indicator based on the calculated equivalent circuit parameters and the identified local frequency of the AC power grid; and processing the value of the grid condition indicator in a grid monitoring system for evaluating the grid condition of the AC power grid, wherein the step of processing the value of the grid condition indicator in the grid monitoring system for evaluating the grid condition of the AC power grid comprises at least one of the following actions based on the determined value of the grid condition indicator:
  automatic online selection of a control scheme for an HVDC station connected to the AC power grid;
  validation of threshold values and ranges of the grid condition indicator;
  voltage stability identification;
  updating of an alarm, warnings or information scheme for the grid condition indicator;
  detection of local topology changes of the AC power grid;
  visualization of the value of the grid condition indicator; or
  setting additional power set points for the HVDC station.

13. A method for evaluating a grid condition of an AC power grid, the method comprising the steps of:
  capturing a time series of voltage and current signals of the AC power grid;
  identifying a local frequency of the AC power grid;
  transforming the time series of the voltage and current signals at the identified local frequency of the AC power grid into transformed signals;
  estimating equivalent circuit parameters from the transformed signals based on a description of an equivalent circuit of the AC power grid;
  determining a value of a grid condition indicator based on the calculated equivalent circuit parameters and the identified local frequency of the AC power grid; and
  processing the value of the grid condition indicator in a grid monitoring system for evaluating the grid condition of the AC power grid, wherein the step of processing the value of the grid condition indicator in the automated grid monitoring system for evaluating the grid condition of the AC power grid comprises at least one of the following actions based on the determined value of the grid condition indicator:
  automatic online selection of a control scheme for an HVDC station connected to the AC power grid;
  validation of threshold values and ranges of the grid condition indicator;
  voltage stability identification;
  updating of an alarm, warnings or information scheme for the grid condition indicator;
  detection of local topology changes of the AC power grid;
  visualization of the value of the grid condition indicator; or
  setting additional power set points for the HVDC station.

* * * * *